United States Patent
Elie et al.

(10) Patent No.: US 9,344,083 B2
(45) Date of Patent: May 17, 2016

(54) METHOD FOR OPENING/CLOSING OF A SECURE HANDS-FREE ACCESS BY DETECTION OF MOVEMENT OF A LOWER MEMBER OF A USER

(71) Applicants: CONTINENTAL AUTOMOTIVE FRANCE, Toulouse (FR); CONTINENTAL AUTOMOTIVE GmbH, Hannover (DE)

(72) Inventors: Olivier Elie, Toulouse (FR); Maxime Cordier, Toulouse (FR); Mickael Guibbert, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 264 days.

(21) Appl. No.: 14/022,818

(22) Filed: Sep. 10, 2013

(65) Prior Publication Data

US 2014/0070920 A1 Mar. 13, 2014

(30) Foreign Application Priority Data

Sep. 10, 2012 (FR) .................. 12 58454

(51) Int. Cl.
*B60R 25/00* (2013.01)
*H03K 17/945* (2006.01)
(Continued)

(52) U.S. Cl.
CPC .......... *H03K 17/945* (2013.01); *B60R 25/2054* (2013.01); *G07C 9/00309* (2013.01); *E05F 15/73* (2015.01); *E05Y 2400/858* (2013.01); *G07C 2209/64* (2013.01)

(58) Field of Classification Search
CPC ............ H03K 17/945; B60R 25/2054; G07C 9/00309
USPC ....................................................... 340/5.72
See application file for complete search history.

(56) References Cited

U.S. PATENT DOCUMENTS 4,648,396 A * 3/1987 Raemer ............... A61B 5/0836
128/204.22
7,688,179 B2 * 3/2010 Kurpinski et al. .......... 340/5.72
(Continued)

FOREIGN PATENT DOCUMENTS

CN 202143044 U 2/2012
DE 20 2010 017197 U1 8/2011
(Continued)

OTHER PUBLICATIONS

French Search Report, dated May 8, 2013, from corresponding French application.

*Primary Examiner* — Steven Lim
*Assistant Examiner* — Mancil Littlejohn, Jr.
(74) *Attorney, Agent, or Firm* — Young & Thompson (57) ABSTRACT

A reliable and secure activation of an access based on a detection of movement in a remote access system by providing a secure method for opening/closing of an access in hands-free access mode. The detection of movement relates to the displacement of a lower member of a user by a remote access system, this access system including at least two elements of detection which each emit a signal whose variations (31, 33, 35) are analyzed. The detection of a movement of a lower member is validated by the application of a double verification step according to parameters (dAsA, dAsB) of a criterion for identification (tA, tB; dAsA, dAsB) of a form of variation (F2; A, B) of each signal (31, 33, 35) with a model form of the movement, and according to a criterion for simultaneity of detection of the forms of variation (F2) identified on the two signals.

12 Claims, 5 Drawing Sheets

(51) Int. Cl.
  *B60R 25/20*  (2013.01)
  *G07C 9/00*  (2006.01)
  *E05F 15/73*  (2015.01)

(56) References Cited

U.S. PATENT DOCUMENTS

| | | | |
|---|---|---|---|
| 2007/0247275 A1 | 10/2007 | Steegmann et al. | |
| 2010/0117760 A1 | 5/2010 | Vaysse et al. | |
| 2011/0242303 A1* | 10/2011 | Giraud et al. | 348/77 |
| 2013/0234733 A1* | 9/2013 | Lange | 324/658 |
| 2014/0324273 A1* | 10/2014 | Russ | B60R 25/00 701/29.1 |

FOREIGN PATENT DOCUMENTS

| | | | | |
|---|---|---|---|---|
| EP | 2 228 906 A1 | 9/2010 | | |
| FR | 2827064 A1 | 1/2003 | | |
| FR | 2915331 A1 | 10/2008 | | |
| FR | 2985017 A1 | 6/2013 | | |
| WO | 2005/108175 A1 | 11/2005 | | |
| WO | 2012052210 A1 | 4/2012 | | |
| WO | WO 2012052210 | * 4/2012 | | G01R 1/02 |
| WO | 2012/084111 A1 | 6/2012 | | |
| WO | WO 2012084111 | * 6/2012 | | B60R 25/00 |

\* cited by examiner

| 20a, 20b | - sensor signals |
| F | - low pass filter |
| 21 | - filtering step |
| 20'a, 20'b | - filtered signals |
| 23 | - form verification step |
| 23t | - conformity test |
| 23v | - provisionally validated signals |
| 20"a, 20"b | - instantaneous slopes |
| 25 | - simultaneity verification step |
| 27 | - amplitude coherence step |
| 20v | - validated foot kick signal |
| 29 | - remote control module |

Fig 5

41 - start of detection
45 - instantaneous slope calculation
47 - test for increase in slope
49 - record minimum A
51 - instantaneous slope calculation
53 - second test for increase in slope
55 - record exit point B
57 - calculate duration of travel
59 - compare interval value
61 - compare instantaneous slope to threshold
63 - compare ratio to threshold
65 - provisional validation

METHOD FOR OPENING/CLOSING OF A SECURE HANDS-FREE ACCESS BY DETECTION OF MOVEMENT OF A LOWER MEMBER OF A USER

FIELD OF THE INVENTION

The invention relates to a method for opening/closing of an access by detection of movement of a lower member of a user, allowing a secure hands-free access.

The main, but non-exclusive, application of this invention relates to the opening of vehicle trunks, in order to allow the authorized user to open a trunk with only a foot movement, the user being identified by a badge or a key that he/she is carrying by means of a BCM control module (initials for "body control module") situated in the vehicle.

BACKGROUND OF THE INVENTION

Currently, hands-free access requests mainly consists of the need to position a hand in order to confirm a request for opening/closing an access to a vehicle, and this process comprises two main steps: recognition of a key or a badge authorized to open or close the vehicle near to the access by the BCM of the access system and, in the case of a request for opening, detection of the presence of the hand on a handle.

The implementation of this method necessitates antennas for the detection of authorized keys or badges, contact sensors in the handles, in general capacitive sensors, for the detection of a hand, together with a centralized system for management of the hands-free access requests, which may for example be a computer wholly or partially dedicated to this function.

With regard to the use of the foot for contactless opening, one known application relates to the opening of an operating theater door for hospital staff. The utility model CN 202 143 044 for example provides for the door to be equipped with an inductive sensor for detection of a foot. People wishing to enter or to exit from the theater extend their foot near to the sensor and the signal detected by the sensor is transmitted to a device for controlling a mechanism for opening/closing of the door.

Use of the foot for a hands-free access to the trunk of an automobile is presented in the international patent application WO 2012/052210. This document provides the detection of a movement of a part of the body of the user, for example the foot, by a capacitive detection assembly with two elongated electrodes. These electrodes run horizontally under the trunk, the longer underneath the shorter, and are coupled to a control and evaluation device. The variations of capacitance are monitored with respect to a reference potential, and when the movement is in the detection range, an activation is triggered, for example the opening of the trunk.

The management of the accesses to a vehicle in the framework of the requests for hands-free access using hand detection has been improved in order to combat various interference effects. For example, the patent document FR 2 827 064 aims to identify the interference effects generated by the metallic paints of automobiles by a module for logical interpretation of the durations of the signals received.

One solution provided to the problem of electromagnetic interference is described in the patent document FR 2 915 331. A time-related filtering is provided for the signals coming from the sensors in the access handles, in order to validate or otherwise the presence of a hand on a handle prior to validating a request for opening.

The system for hands-free opening/closing of the prior art therefore offers an appreciable comfort for users, with a confirmation of opening/closing of an access given by the presence of a hand or by a foot movement. However, false detections such as those resulting from interference effects caused by atmospheric phenomena, in particular rain, or other types (electromagnetic interference, objects passing under the bumper, etc.) are not identified and unexpectedly trigger a spurious request for opening. Solutions exist for overcoming certain interference effects for opening/closing operations using the hand, but no reliable solution exists for foot movement detection systems. Even if, in the latter case, the detection system is based on two sensors per access, the system has not been made sufficiently reliable in a noisy environment.

SUMMARY OF THE INVENTION

The invention aims to provide a solution to the need for a reliable and secure activation of an access based on a detection of movement of a lower member of a user, even in an environment with interference effects. For this purpose, the invention provides a comparison of the form and of the behavior over time of the signals received by the electrodes in question in order to discriminate the useful signals from the signal variations due to noise.

More precisely, the subject of the present invention is a method for opening/closing of an access in hands-free access mode made secure by detection of a leg/foot, referred to as lower member, movement of a user by a remote access system. This access system comprises at least two means of detection. The detection means each emit a signal whose variations are analyzed. The detection of a movement of a lower member is validated by the application of a double verification step according to a criterion for identification of a form of variation of each signal with a model form of said movement, and according to a criterion for simultaneity of detection of the forms of variation identified on the signals.

According to embodiments that are particularly advantageous, the method according to the invention may also include the following steps:

the form to be verified being represented by a sharp point between two slopes of opposite signs of the V-shaped type, the form identification criterion comprises the detection of times of critical changes of variation in slope inclination of this form, corresponding to the detection of a sharp point and of a form exit, in order to acquire the values of the critical variations in slope inclination at the sharp point and at the form exit, the determination of the values of a ratio R of the variation in instantaneous amplitude and of duration EtA of travel of the form, together with comparisons of these values of critical variations in slope inclination, of the ratio R of variation in amplitude and of duration EtA of the form with predefines threshold values;

the determination of the ratio of variation in instantaneous amplitude is carried out based on the variation in signal amplitude between a point of critical change in instantaneous inclination and a current point, divided by the duration of travel between these points;

the form identification criterion comprises a test for strictly increasing slopes of the forms verified prior to validation;

the criterion for simultaneity of the forms is verified when the difference Etmax between the times of detection of their sharp points is less than a predefined value, in particular less than 250 ms;

an additional verification step consists in applying a coherence criterion by determining the ratio between the larger and the smaller of the variation amplitudes of a pair of forms from various signals, satisfying the identification and simultaneity criteria, and in validating this additional step when this ratio is substantially equal to or less than a predefined value, in particular less than or equal to 4;

the variation amplitude of the forms satisfying the identification and simultaneity criteria is measured by the ratio of the amplitudes between the sharp point and the form exit.

Thus, one of the advantages of the invention is to be able to compare, with determinant criteria, signals coming from at least two detection means, which allows all the noise effects to be eliminated. Another advantage of this method is that it allows a simplified implementation with a reduced memory requirement and a high speed in the calculations.

Preferably, the verifications performed on the signals are preceded by a step for filtering the signals intended to eliminate the interference effects due to the high frequency variations.

BRIEF DESCRIPTION OF THE DRAWINGS

Other data, features and advantages of the present invention will become apparent upon reading the non-limited description that follows, with reference to the appended figures which show, respectively.

DETAILED DESCRIPTION OF THE INVENTION

With reference to the external views in FIG. 1 of a rear part of an automobile vehicle 100, a remote access system comprises two electrodes forming sensors 1 and 2 for detection of a movement of a user lower member. These sensors (also respectively referred to as "upper" and "lower") are arranged above one another in the rear bumper 101, situated under the trunk 102 of the vehicle 100. The sensors 1 and 2 are arranged at the level of a lower member, formed of a leg 3 and of a foot 4 of a user of average height. For symmetry reasons of access to the trunk 102, the sensors are situated preferably in the plan of symmetry of the vehicle 100.

Figure 1A:
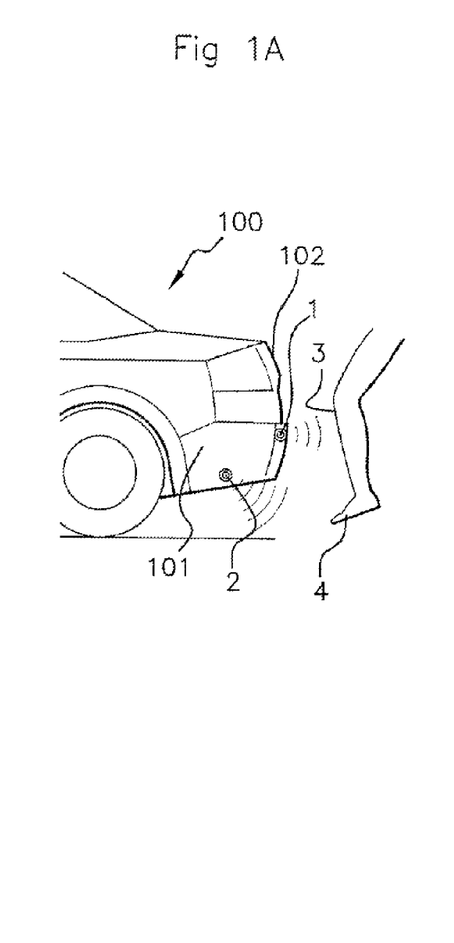
FIG. 1, various external views (diagram 1A to 1C) of a rear part of a vehicle equipped with two sensors of one example of a remote access system with a detection of leg/foot movements of a user (or kick from the lower member)
Figure 1B:
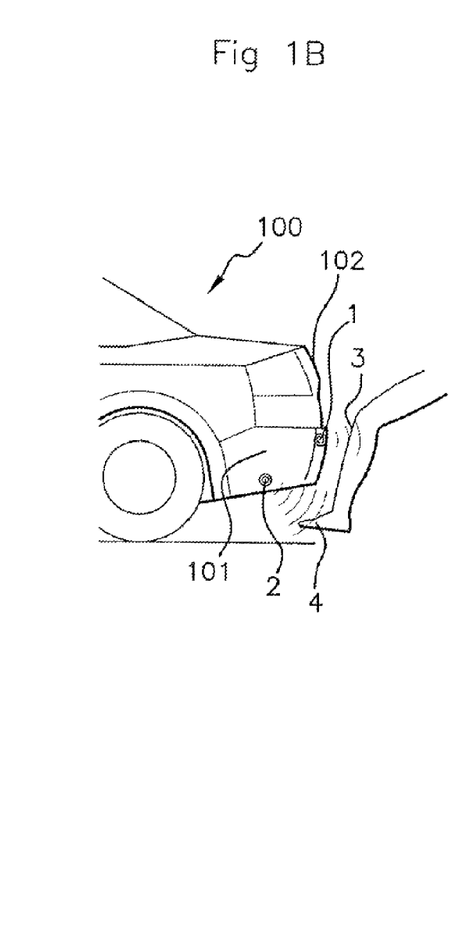
Figure 1C:
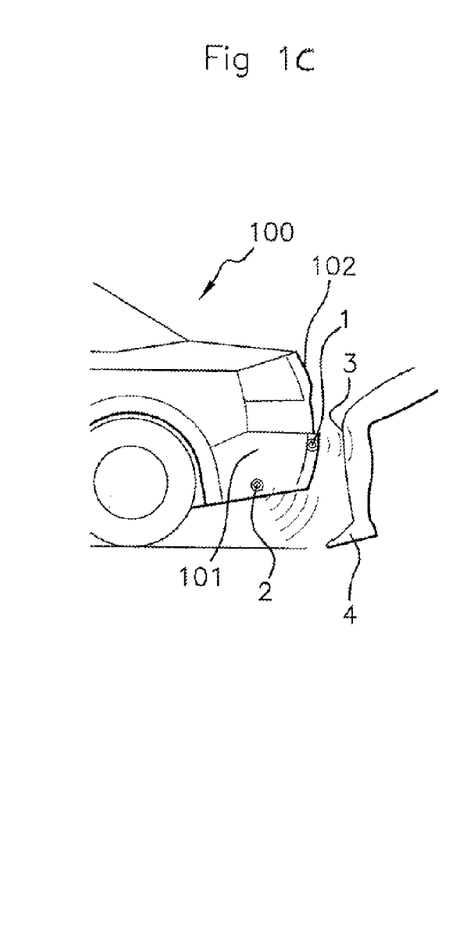

The diagrams 1A, 1B and 1C show the movement of the lower member of the user in a back-and-forth motion referred to as "kick movement" under the trunk of the vehicle 100. The convention for use of the remote access system allows the authorized user, by the identification of his/her badge, to open the trunk 102 by a forward movement (going from the diagram 1A to diagram 1B) then a reverse movement (going from the diagram 1B to diagram 1C) of the leg 3 and of the foot 4 under the trunk 102 of the vehicle 100. This movement signals an order to open the mechanism of the trunk 102 by a suitable control command.

Figure 2A:
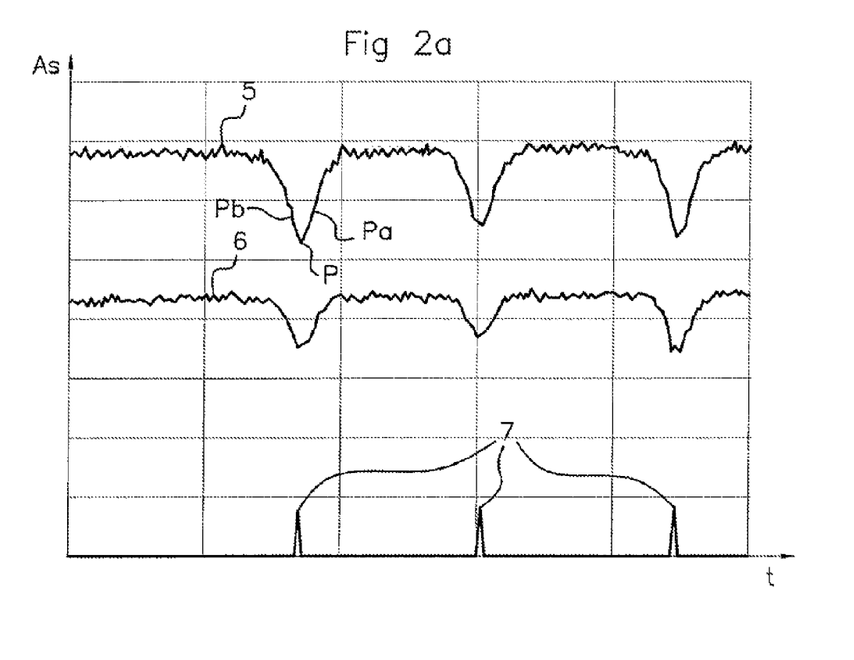
FIGS. 2a and 2b, diagrams of the measurements supplied by these two sensors in the form of variations of signals, respectively in the case of a noise-free environment and in the case of a noisy environment due to rain.
Figure 2B:
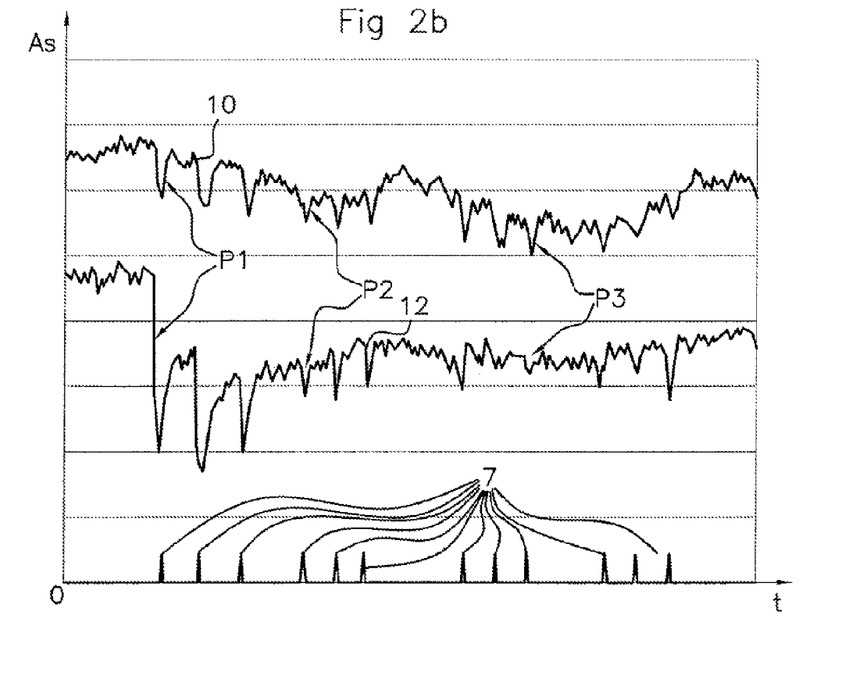
Figure 3:
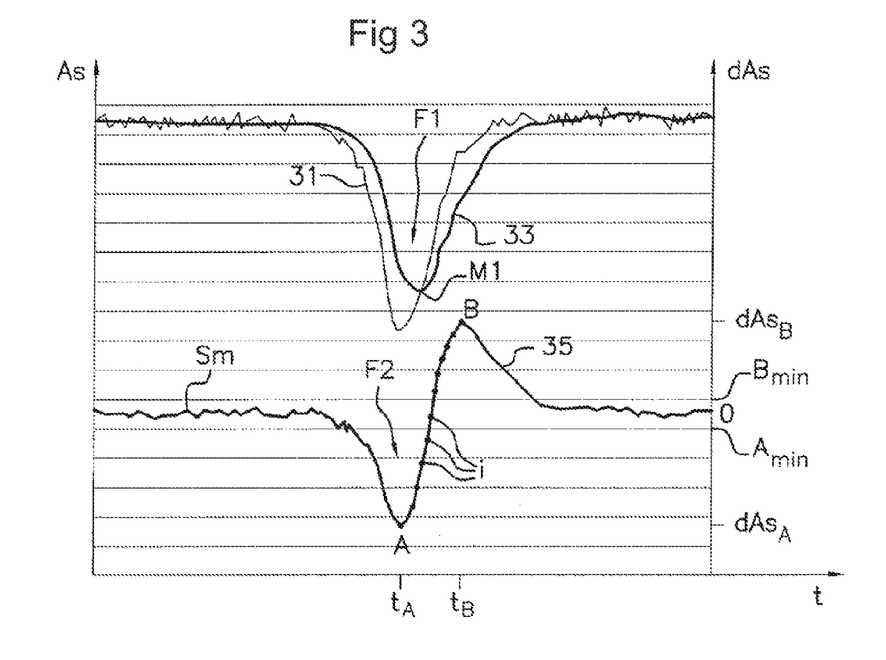
FIG. 3, diagrams of a detailed variation of a signal before and after filtering, together with the instantaneous slope of this signal, during a characteristic kick movement of the user.

In FIGS. 2a, 2b and 3, amplitudes of signals As a function of the time "t" are plotted. FIG. 2a illustrates the measurements supplied by the sensors 1 and 2 in the form of diagrams 5 and 6 of signal variations in the case of a noise-free environment. On the time "t" abscissa axis, the times of production of three successive foot kicks 7 are plotted. The signal amplitudes are measured and recorded periodically as a function of the time "t". The elementary interval of time $\Delta t$ between two measurements is defined experimentally. In this example, $\Delta t$ is around 20 ms.

When the foot kicks occur, the diagrams 5 and 6 show drops in level of the signals. In this noise-free environment, the signal/noise ratio is high, and the detection of each foot kick movement has a distinct "V" shape with, successively over time, a descending slope Pd then an ascending slope Pa, surrounding an sharp point P, situated at the low peak of the "V".

The simultaneity of the two diagrams 5 and 6 confirms the existence of foot kicks 7. In a situation with no interference, the signal forms analysis supplied by the foot kicks from a sample of people, varying by their height or by their manner of kicking, allows a set of ranges of values to be validated. This set defines a model form of signal variation corresponding to a foot kick (see the complementary explanations with reference to FIG. 4).

FIG. 2b presents one example of the measurements supplied by the two sensors of the access system in the form of diagrams 10 and 12 of variations of signals, in the case of a noisy environment due to rain. On the time abscissa axis the times of production of the foot kicks 7 are plotted. At these times, the diagrams 10 and 12 show drops in signals level, as in a noise-free environment (FIG. 2a). However, in a noisy environment, the foot kicks 7 are more difficult to identify on the variations of signals in the diagrams 10 and 12 owing to a lower signal/noise ratio. After analysis of the signals according to the identification and simultaneity criteria of the invention, as explained hereinafter, the variations of signals P1, P2, and P3 will be validated as "V"-shaped forms corresponding to foot kicks.

With reference to FIG. 3, diagrams 31 and 33 of detailed variations of the amplitudes As of a signal exhibiting a form F1 corresponding to a "V"—resulting from a foot kick—are illustrated. The diagram 31 corresponds to the signal from the upper sensor 1. The diagram 33 is the result of a low-pass filter being applied to the curve 31: as the irregularities have been filtered out, the diagram 33 is shifted by the small delay due to the filtering.

The diagram 35, illustrated in the same figure, corresponds to the instantaneous variation dAs of the signal in the filtered diagram 33. This variation dAs represents the derivative function of the signal in the filtered diagram 33 or, in other words, the instantaneous variation of the slope of this signal. The variation dAs takes a form F2, also "V"-shaped, defined between a minimum value dAsA at the sharp point A and a maximum value dAsB at the form exit B. Away from the form F2, the instantaneous level of signal variation forms an average base level Sm which oscillates substantially around zero. This level Sm results from the fact that the amplitude As of the signal 33 is substantially constant.

The verification criteria for detection of a foot kick from an authorized user, according to the invention, utilize parameters for identification of the form of variation F2, namely:

the critical changes in slope inclination at the times tA and tB correspond to the sharp point A and to the slope exit B, and are respectively determined by the minimum dAsB and the maximum dAsA of the instantaneous variation in slope of the signal As in the diagram 33;

the amplitudes dAsA, dAsB are respectively greater (in absolute value) than thresholds Amin and Bmin, Amin and Bmin being equal (in relative values) to −5 and +5 units in the example;

the dots "i" on this diagram 35 symbolize the measurements made at the times successively separated by the elementary intervals of time Δt around 20 ms; in the example, the period of time between the point A and the point B is longer than 300 ms and shorter than 1000 ms;

the ratio between the difference of the amplitude variations at the points A and B of the form F2 and the number of elementary periods Δt between these two points is, in the example, greater than 1.

Figure 4:
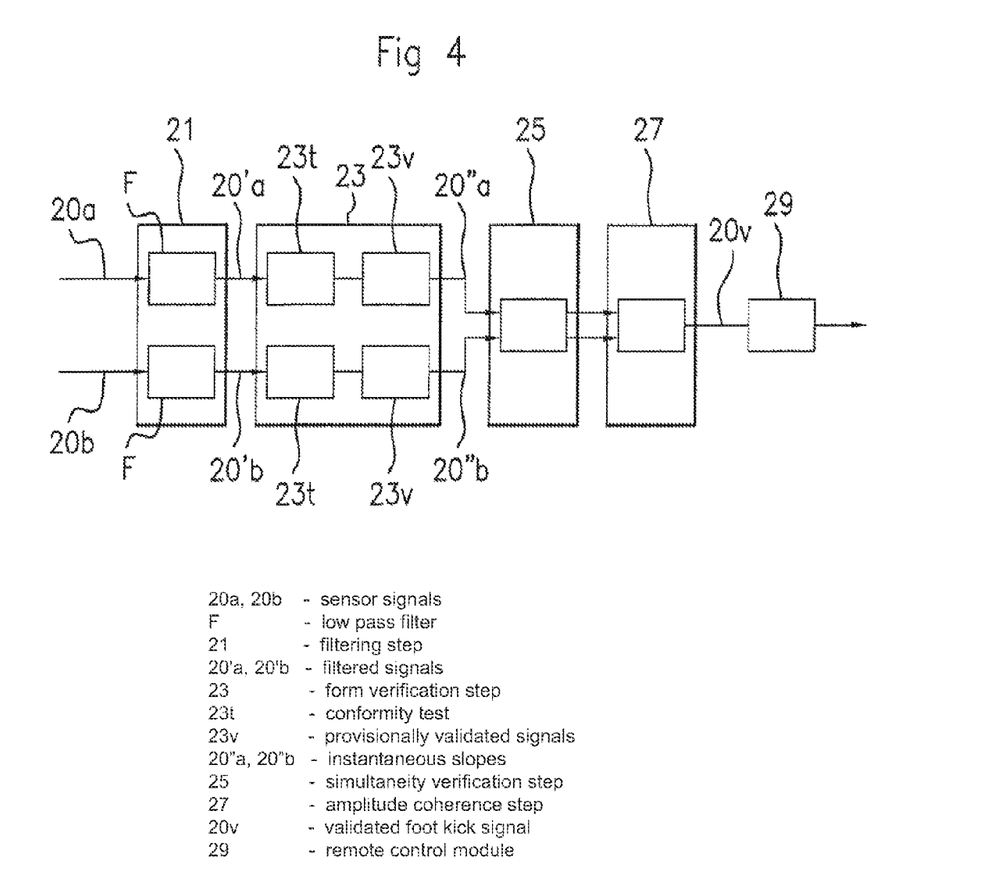
FIG. 4, a block diagram of processing of the signals supplied by these two sensors based on form, simultaneity and amplitude comparison criteria, and FIG. 5, one example of logic flow diagram for detection of movement characteristic of a foot kick according to the invention.

FIG. 4 shows one example of processing of the signals supplied by the sensors in the form of a block diagram, based on the analyses hereinabove, for verifying the form identification, simultaneity and amplitude comparison criteria according to the invention. The signals 20a and 20b supplied by the sensors are first of all (step 21) each subjected to a low-pass filter F with a coefficient equal to ⅙, used to filter out all the high-frequency variations due to noise. Then, at the form verification step 23, each of the filtered signals 20'a and 20'b undergoes an analysis for verification of the variations of the signals after filtering and of their instantaneous variations 20"a and 20"b.

This verification analysis consists in applying a form identification criterion for "V"-shaped variation of the signals. This criterion comprises tests 23t for conformity with a model form that can indicate the existence of a foot kick. The "V"-shaped forms thus selected are validated provisionally at 23v.

The two following steps involve comparisons between the diagrams of instantaneous slope 20"a and 20"b coming from the measurements made by the two electrodes.

At the step 25, the simultaneity of the pair of forms selected on the two signals 20"a and 20"b is verified. The criterion consists in checking that the interval EtA between the times of detection of the sharp points of two forms selected, each form being on one signal, is shorter than a pre-established value Etmax, for example 180 ms.

At the step 27, the V-shaped forms of the signals 20"a and 20"b, verified by the identification and simultaneity criteria at the steps 23 and 25, may advantageously be subjected to an additional amplitude coherence criterion. This criterion consists in comparing the amplitudes of the forms selected by establishing their ratio. The amplitude of each form is represented by the difference between the level of the form exit B and the level of the sharp point A. In particular, the ratio between the larger and the smaller of the amplitudes of the two forms selected is less than 4.

In addition, the criterion for amplitudes comparison can advantageously provide for these amplitudes to remain lower than a predefined value. After this last amplitude verification, the foot kick is validated and this validation is subsequently transmitted (signal 20v) to the module 29 for remote control of the accesses.

Figure 5:
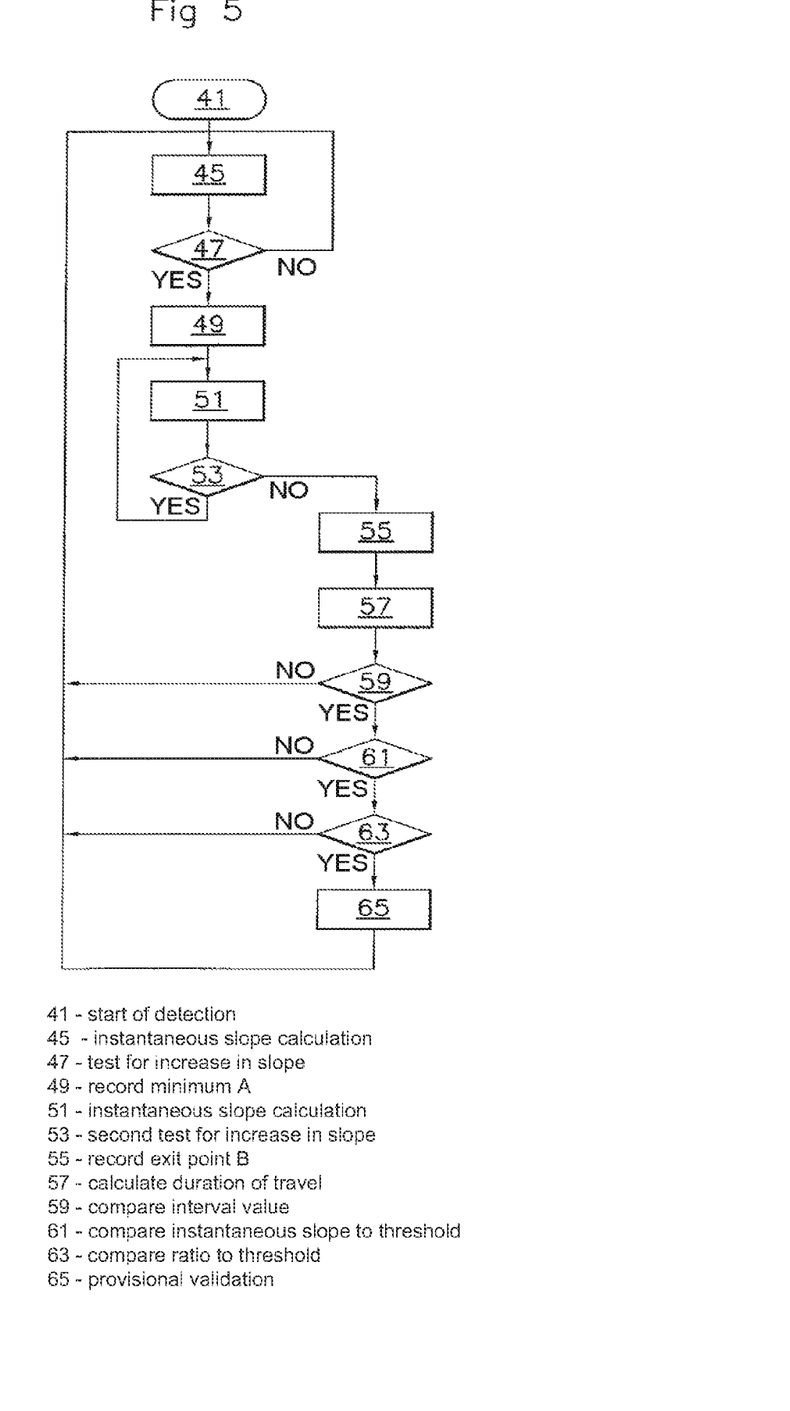

FIG. 5 shows one example of logic flow diagram for detection of a model foot kick movement according to the invention. This detection corresponds to the tests at the step 23 in FIG. 4. The start of the detection (step 41) begins when the remote access system is in a standby state. While still remaining in a standby state, the system calculates (step 45) the instantaneous slope inclination of the diagrams by the variations of signal amplitude at the times separated by the elementary intervals of time Δt. Then, a test for increase in slope (step 47) is carried out by comparing the instantaneous inclination with a predefined threshold value, in order to detect the sharp point of a V-shaped form corresponding to a model kick.

If the response is NO to a first test for "increasing slope" (step 47)—in other words "strictly increasing"—the process is looped back to the state for measuring the instantaneous inclination (step 45). When the slope satisfies this test, the signal has finished its decreasing trend and begins to increase, hence creating a minimum. This minimum is recorded (step 49) and corresponds, for example, to the sharp point "A" in FIG. 3. The point "A" corresponds to a critical change in the instantaneous slope inclination.

The process continues with the calculation of instantaneous inclination (step 51), then a second test for "increasing slope" (comparison step 53). However, the conclusions of the step 53 are reversed with respect to the first test for "increasing slope" at the step 47: if the slope is still increasing in the comparison step of 53, the process is looped back to the inclination calculation (step 51), whereas if the slope ceases to be sufficiently increasing, an exit point "B" is recorded (step 55). This exit point corresponds to the end of slope "B" in FIG. 4. This exit point also corresponds to a critical variation in the instantaneous slope inclination.

Once the detection of the increasing slope of the "V"-shaped form is finished, the process (step 57) calculates the duration of travel of the V-shaped variation between the ends "A" and "B" of the increasing slope, based on the number of inputs points (dots "i" in FIG. 3) during the detection process of this form.

This number of input points is compared with values interval (step 59), so as to verify whether the travel duration of the increasing slope AB of the "V"-shaped form is really in the range between two predetermined time values, for example between 300 ms and 1000 ms. This step 59 performs the duration test of the "V"-shaped form. If the response is "NO" to this step, the "V"-shaped variation selected is not validated, and the process returns to the start (step 41).

If the response is "YES", the duration test is satisfied and a decision step (step 61) verifies whether the instantaneous variations of the slopes dAS (FIG. 3) at the ends A and B have a value (in absolute value) greater than predetermined threshold values, for example 5 (in relative values: variations dAs at the point A lower than −5 and at the point B higher than +5 in the example).

A final test (decision step 63) involves the monitoring by a ratio "R" defining the variation amplitude of the signal between a point of critical change in instantaneous inclination and a current point, divided by the unit of time (by dividing by the number of measurement points made during this variation). If the ratio R is less than a predefined threshold value Rmin, 1.5 in the example, the response "NO" sends the process back to the start (step 41).

However, if the ratio R remains higher than the pre-established value Rmin, the selected form is provisionally validated at the step 65 (which corresponds to the validation step 23v in FIG. 4). The selected form appears on each signal and the simultaneity criterion is subsequently applied to this pair of forms as explained hereinabove with regard to FIG. 4. If the pair of forms selected satisfies this simultaneity criterion, its validation is confirmed and the remote access system is made secure.

In addition, the coherence criterion for amplitudes of the selected forms pair such as described with regard to FIG. 4 may subsequently be applied in order to reinforce the validation as needs be.

The invention is not limited to the exemplary embodiments described and shown. The remote access system can comprise more than one pair of sensors, for example two or even three pairs or more. Moreover, the invention may be applied to the opening of any access needing to have the possibility of being opened without contact by the legs, such as some doors of buildings (businesses, services receiving the public, hospitals, for example). This type of access, if its situation is exposed to various elements causing interference, must be able to have a system for management of the accesses that is robust and unaffected by noise signals.

The invention claimed is:

1. A method for opening/closing an access (102) in hands-free access mode made secure by detection of movement of a lower member (3, 4) of a user by a remote access system, this access system comprising at least two means of detection (1, 2) which each emit a signal whose variations (10, 12; 31, 33, 35) are analyzed, the method comprising:
   validating detection of a movement of the lower member of the user (3, 4) by application of a double verification step according to a criterion for identification of a form of variation (F2) of each signal's derivative function with a model form of said movement (23), and according to a criterion for simultaneity of detection of the forms of variation (25) identified on the signal's derivative function,
   wherein the form of variation (F2) to be verified includes points (A, B,) between two slopes of opposite signs of V-shaped type,
   wherein the identification criterion comprises detecting times (tA, tB) of critical changes in variation of slope inclination of the form of variation (F2), corresponding to a first one of said points (A) and a second one of said points (B) of the form of variation (F2), in order to acquire values of the critical changes in variation of slope inclination (dAsA, dAsB) at the first point (A) and at the second point (B),
   determining values of a ratio R of variation in instantaneous amplitude and of duration EtA of travel of the form of variation (F2), and
   comparing (61, 63, 59) these values of critical variations in slope inclination (dAsA, dAsB), of the ratio R of variation in amplitude, and of duration EtA of the form of variation (F2) with predefined threshold values (Amin, Bmin; Etmax; Rmin).

2. The opening/closing method as claimed in claim 1, in which the determination of the ratio (R) of variation in instantaneous amplitude is carried out based on the variation in signal amplitude between the first and second points (A, B) and a current point, divided by the duration of travel between these points.

3. The opening/closing method as claimed in claim 1, in which the form identification criterion (23) comprises a test for a strictly increasing slope (47, 53) of the form of variation (F2) verified before validation.

4. The opening/closing method as claimed in claim 1, in which the criterion for simultaneity of the forms is verified when a difference between the times of detection of their respective first points (A) is less than a predefined value.

5. The opening/closing method as claimed in claim 4, in which the predefined value is 250 ms.

6. The opening/closing method as claimed in claim 1, further comprising applying a coherence criterion by determining the ratio between the larger and the smaller of the variation amplitudes (27) of a pair of the form of variation (F2) from different signals, satisfying the criteria for identification (23) and for simultaneity (25), and validating this additional step when this ratio is substantially equal to or less than a predefined value.

7. The opening/closing method as claimed in claim 6, in which the ratio of the variation amplitudes is equal to or less than 4.

8. The opening/closing method as claimed in claim 6, in which the variation amplitude of the forms satisfying the identification and simultaneity criteria is measured by the difference in amplitude between the first point (A) and the second point (B).

9. The opening/closing method as claimed in claim 1, in which the verifications carried out on the signals are preceded by a step for filtration of signals (21) to eliminate the interference effects due to high frequency variations.

10. The opening/closing method as claimed in claim 2, in which the form identification criterion (23) comprises a test for a strictly increasing slope (47, 53) of the form of variation (F2) verified before validation.

11. The opening/closing method as claimed in claim 2, in which the criterion for simultaneity of the forms is verified when the difference between the times of detection of their respective first points (A) is less than a predefined value.

12. The opening/closing method as claimed in claim 7, in which the variation amplitude of the forms satisfying the identification and simultaneity criteria is measured by the difference in amplitude between the first point (A) and the second point (B).

* * * * *